United States Patent
Hirano et al.

(10) Patent No.: US 6,958,535 B2
(45) Date of Patent: Oct. 25, 2005

(54) THERMAL CONDUCTIVE SUBSTRATE AND SEMICONDUCTOR MODULE USING THE SAME

(75) Inventors: Koichi Hirano, Osaka (JP); Yoshihisa Yamashita, Kyoto (JP); Seiichi Nakatani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 254 days.

(21) Appl. No.: 09/956,208

(22) Filed: Sep. 18, 2001

(65) Prior Publication Data

US 2002/0096759 A1 Jul. 25, 2002

(30) Foreign Application Priority Data

Sep. 22, 2000 (JP) .......................... 2000-288126

(51) Int. Cl.[7] ................... H01L 23/10; H01L 23/34
(52) U.S. Cl. ............... 257/707; 257/668; 257/670; 257/675; 257/712; 257/718; 438/457
(58) Field of Search ............... 438/457; 257/670, 257/718, 712, 675, 668, 707; 361/766, 782, 720

(56) References Cited

U.S. PATENT DOCUMENTS

| | | | | |
|---|---|---|---|---|
| 4,399,089 A | * | 8/1983 | Mohri et al. ............... 264/602 |
| 4,621,304 A | * | 11/1986 | Oogaki et al. ............... 361/720 |
| 4,803,115 A | * | 2/1989 | Fushiki et al. ............... 428/415 |
| 5,038,132 A | * | 8/1991 | Lindblom et al. ............... 338/307 |
| 5,316,831 A | * | 5/1994 | Nakajima et al. ............... 428/209 |
| 5,834,101 A | * | 11/1998 | Hayashi ............... 428/209 |
| 5,866,240 A | * | 2/1999 | Prabhu et al. ............... 428/210 |
| 5,894,984 A | * | 4/1999 | Sakai et al. ............... 228/180.22 |
| 6,005,773 A | * | 12/1999 | Rozman et al. ............... 361/707 |
| 6,060,150 A | * | 5/2000 | Nakatani et al. ............... 428/209 |
| 6,111,306 A | * | 8/2000 | Kawahara et al. ............... 257/666 |
| 6,154,365 A | * | 11/2000 | Pollard et al. ............... 361/704 |
| 6,479,318 B2 | * | 11/2002 | Matsuo et al. ............... 438/106 |
| 6,599,637 B1 | * | 7/2003 | Itoh et al. ............... 428/472 |
| 6,633,078 B2 | * | 10/2003 | Hamaguchi et al. ............... 257/686 |

FOREIGN PATENT DOCUMENTS

| | | | |
|---|---|---|---|
| EP | 0279601 | * | 12/1988 |
| JP | 63-270133 | * | 11/1988 |
| JP | 363270106 | * | 11/1988 |
| JP | 64-50592 | * | 2/1989 |

(Continued)

*Primary Examiner*—Craig A. Thompson
*Assistant Examiner*—James M. Mitchell
(74) *Attorney, Agent, or Firm*—Hamre, Schumann, Mueller & Larson, P.C.

(57) ABSTRACT

A semiconductor module includes a circuit substrate composed of a wiring pattern, an electrical insulating layer and a thermal radiation board, and in use is fixed to an external thermal radiation member, in which the electrical insulating layer is composed of a thermal conductive mixture containing 70–95 wt % of an inorganic filler and 5–30 wt % of a thermosetting resin. A warping degree of the circuit substrate with respect to the external thermal radiation member is at most 1/500 of a length of the substrate, and the circuit substrate warps to protrude toward the thermal radiation board as the temperature rises. Accordingly, the thermal radiation property does not deteriorate even when the temperature rises in use. At a time of fixing the circuit substrate to the external thermal radiation member, the thermal resistance is kept to be a sufficiently low level. The thermal resistance is kept in a low level without sacrificing the contact between a module and the external thermal radiation member even at a high temperature during an operation of the device or the like, and the thermal conductive substrate is resistant to fractures or cracks and thus is highly reliable.

24 Claims, 7 Drawing Sheets

FOREIGN PATENT DOCUMENTS

| | | | |
|---|---|---|---|
| JP | 06-85120 | * | 3/1994 |
| JP | 06-97670 | * | 4/1994 |
| JP | 08-222838 | * | 8/1996 |
| JP | 09181219 | * | 7/1997 |
| JP | 10-173097 | | 6/1998 |
| JP | 10-154774 | | 9/1998 |
| JP | 10-270830 | | 10/1998 |
| JP | 2000-150741 | * | 5/2000 |

* cited by examiner

THERMAL CONDUCTIVE SUBSTRATE AND SEMICONDUCTOR MODULE USING THE SAME

BACKGROUND OF THE INVENTION

1. Field of the Invention

The present invention relates to circuit substrates used for various electric and electronic apparatuses and also semiconductor modules using the same. Particularly, the present invention relates to thermal conductive substrates suitable for apparatuses that are used in a field of power electronics or the like and require improved thermal radiation property.

2. Description of Related Art

Recently, as high performance and miniaturization of electronic apparatuses have been required, high density and high performance semiconductors have been sought. Consequently, circuit substrates for mounting thereof also have been required to be small and of high density. As a result, it is important to design circuit substrates taking the thermal radiation property into consideration. While many conventional printed circuit boards are made of a glass-epoxy resin, a well known technique for improving the thermal radiation property of circuit substrates includes using a metal base substrate of a metal such as copper or aluminum and forms a circuit pattern on one face or both faces of this metal substrate with an insulating layer interposed in between the circuit pattern and the metal substrate. Moreover, when higher thermal conductivity is required, the metal base substrate is made of a copper board, which is directly bonded to a ceramic substrate made of, for example, alumina or aluminum nitride. For an application requiring relatively small electric power, a metal base substrate is generally used. In this case, however, in order to improve the thermal conduction, the insulating layer must be thin. Therefore, the spacing between the circuit pattern and the metal plate is susceptible to noise, and the withstand voltage is insufficient.

For avoiding such problems, references have suggested substrates made by integrating lead frames as electrodes and compositions containing resins filled with fillers having good thermal conductivity. For example, JP-A-10-173097 (1998) suggests a substrate comprising such a composition. A method of manufacturing the thermal conductive substrate is shown in FIGS. 7A and 7B. According to the reference, a sheet of a thermal conductive mixture 72 is manufactured from a slurry of a mixture containing an inorganic filler and a thermosetting resin. After a drying step, the sheet of the thermal conductive mixture 72 is laminated on a lead frame 71 as shown in FIG. 7A, and then, the laminate is cured by applying heat and pressure to provide a thermal conductive substrate 74 comprising an electrical insulating layer 73 as shown in FIG. 7B.

In general, a semiconductor module comprising such a substrate designed for improving thermal radiation is contacted properly with an external thermal radiation member in order to transfer heat generated at the semiconductor and respective components to the external thermal radiation member, so that the temperatures of the semiconductor and the respective components will be kept not higher than a certain level. For this purpose, thermal radiation boards having high thermal conductivity often will be provided to the substrate on a surface to be contacted with an external thermal radiation member.

In this case, the thermal radiation board of the circuit substrate and the external thermal radiation member should be fixed firmly to each other, and these components should be contacted sufficiently with each other for reducing thermal resistance therebetween. In general, a semiconductor module is fixed to an external thermal radiation member by a screw or the like. More specifically, screw holes or openings are formed at four corners or sides of a semiconductor module, i.e., at four corners or sides of a circuit substrate, in order to fix the semiconductor module to the external thermal radiation member. For decreasing thermal resistance, the circuit substrate and the external thermal radiation member are fixed after being provided with a thin coating of a silicone compound or the like, since the silicone compound has a relatively good thermal conductivity.

The flatness of a circuit substrate is an essential factor for improving contact and for reducing thermal resistance while fixing the circuit substrate or a semiconductor module using the same to an external thermal radiation member. Considerable warping in the circuit substrate will create a space between the circuit substrate and the external thermal radiation member, and thus, the thermal resistance is increased. Especially when the circuit substrate warps greatly and moves away from the thermal radiation board, the circuit substrate is contacted with the thermal radiation member only at the four corners or sides but not at the central part. As a result, the thermal resistance is raised and the temperature of the module rises so much that abnormal operation and failure of the components result. When the circuit substrate warps and protrudes toward the thermal radiation board, the circuit substrate is contacted well with the external thermal radiation member. However, stress will occur at a time of fixing, which causes fractures and cracks of the insulating layer. Otherwise, peeling occurs between either the wiring pattern or the thermal radiation board and the insulating layer.

Generally, such a circuit substrate of a semiconductor module is fixed to an external thermal radiation member at room temperature. However, since the circuit substrate is constructed by laminating layers of various materials, a warping degree of the board varies depending on the temperature. Therefore, even if the circuit substrate is contacted sufficiently with the external thermal radiation member at the time of fixing, the circuit substrate warps due to the temperature rise during the operation of the semiconductor module so that the contact area is reduced to cause thermal runaway of the semiconductor module.

When warping of the board varies considerably depending on the temperatures, stress on the board is increased at a time of fixing the board to an external thermal radiation member. As a result, fractures or cracks occur in the board, which results in insulation failure or degradation in the reliability.

SUMMARY OF THE INVENTION

In order to dissolve the problems mentioned above, the present invention aims to provide a reliable thermal conductive substrate and a semiconductor module using the same. The thermal conductive substrate can keep the thermal resistance at a sufficiently low level at a time of fixing the circuit substrate to an external thermal radiation member for use. Especially when the temperature rises during operation of the apparatus, a contact between the module and the external thermal radiation member is strengthened to keep the low thermal resistance, without causing fractures or cracks in the substrate.

For achieving the purpose, a thermal conductive substrate according to the present invention comprises a wiring pattern, an electrical insulating layer and a thermal radiation board, in which the electrical insulating layer is made of a thermal conductive mixture containing 70–95 wt % of an inorganic filler and 5–30 wt % of a thermosetting resin, and the thermal radiation board is adapted to be fixed to the external thermal radiation member for use. The warping degree of the thermal conductive substrate with respect to the external thermal radiation member after mounting of a component is 1/500 or less of the substrate length at room temperature, and the thermal conductive substrate warps to protrude toward the thermal radiation board as the temperature of the thermal conductive substrate rises. In the present invention, a room temperature indicates a range from 0° C. to 40° C.

A semiconductor module according to the present invention comprises a semiconductor device and a passive part mounted for providing a circuit function to the thermal conductive substrate, and comprises a connector at a portion selected from the top portions or sides of the thermal conductive substrate in order for attachment to an external thermal radiation member. The connector can be in the form of an aperture for accepting a screw or the like; it can be replaced by any suitable attachment.

A thermal conductive substrate obtained according to the present invention is a circuit substrate comprising at least a wiring pattern, an electrical insulating layer and a thermal radiation layer, in which the substrate warps to protrude toward the thermal radiation board as the temperature rises. Accordingly, thermal radiation from a semiconductor module comprising the thermal conductive substrate to the external thermal radiation member is not hindered even if the temperature rises at a time of operation of the module, and thus, a thermal conductive substrate having improved thermal radiation property can be provided. Furthermore, the substrate will have less cracks or peeling caused by warping at a high temperature or by stress occurring in the electrical insulating layer, and thus, a highly reliable substrate can be obtained. Use of the thermal conductive substrate according to the present invention will provide a highly reliable semiconductor module with a good thermal radiation property.

DETAILED DESCRIPTION OF THE INVENTION

Figure 1:
FIG. 1 is a cross-sectional view showing a thermal conductive substrate in a first embodiment of the present invention.

A thermal conductive substrate according to the present invention is designed to press against an external thermal radiation member even when a semiconductor device mounted on the thermal conductive substrate operates and the temperature rises. As a result, the substrate will be contacted with the external thermal radiation member sufficiently, and moreover, the pressing force can lower the thermal resistance, so that the semiconductor device will have high thermal radiation property and reliability. Depending on the conditions of surfaces of the thermal radiation board and the external thermal radiation member, it is possible to omit some thermal conductive members such as a thermal radiation compound or a resin sheet, which generally are provided between a substrate and an external thermal radiation member.

After mounting of components, the warping degree of a thermal conductive substrate with respect to the external thermal radiation member is 1/500 or less of the substrate length at room temperature. Accordingly, a space between the substrate and the external thermal radiation member is reduced sufficiently, and this will improve external thermal radiation.

Preferably, the thermal conductive substrate according to the present invention comprises a thermal radiation board having a thermal expansion coefficient larger than an average thermal expansion coefficient of the wiring pattern and of the electrical insulating layer. Accordingly, the thermal radiation board expands more than the wiring pattern or than the electrical insulating layer as the temperature rises, and thus, the thermal conductive substrate warps to protrude toward the thermal radiation board with the rise of the temperature. As a result, thermal radiation from the substrate to the external thermal radiation member at a time of temperature rise can be improved.

Preferably in the thermal conductive substrate according to the present invention, a thermal expansion coefficient α1 of the thermal radiation board is larger than a thermal expansion coefficient α2 of the electrical insulating layer at or below the glass transition temperature, and the thermal expansion coefficient α2 is larger than a thermal expansion coefficient α3 of the wiring pattern. Accordingly, similar to the above-mentioned case, the thermal radiation board expands more than the electrical insulating layer or than the wiring pattern as the temperature rises, and the electrical insulating layer expands more than the wiring pattern. Therefore, the thermal conductive substrate warps to protrude toward the thermal radiation board as the temperature rises so as to improve thermal radiation from the substrate to the external thermal radiation member. Furthermore, a relationship of the thermal expansion coefficients represented by α1>α2>α3 is efficient in decreasing stress caused by mismatching thermal expansion coefficients between the respective layers. As a result, the thus obtained substrate is resistant to damage and highly reliable.

It is preferable in the thermal conductive substrate according to the present invention that the thermal conductive mixture composing the electrical insulating layer has an elastic modulus of at most 50 GPa at room temperature. When a thermal conductive substrate is fixed to an external thermal radiation member so as to suppress warping in the substrate, stress occurring in the thermal conductive substrate will induce cracks in the thermal conductive mixture composing the electrical insulating layer. A thermal conductive substrate according to the present invention will have no substantial cracks in use, so that the present invention can provide a highly reliable substrate.

Preferably, the electrical insulating layer of the thermal conductive substrate according to the present invention contains a reinforcer. More preferably, the reinforcer is a glass nonwoven fabric. The reinforcer improves mechanical strength and processability of the electrical insulating layer, and allows considerable adjustment of the thermal expansion coefficient. Preferably, the reinforcer is a glass nonwoven fabric, especially from the aspects of thermal conductivity, cost and substrate manufacturability.

It is preferable for the thermal conductive substrate according to the present invention that the wiring pattern, including the spacing, is filled with the electrical insulating layer so as to form a substantially flush surface. Such a substrate is convenient for mounting a component, and a solder-resist treatment for the mounting can be carried out corresponding to a case of a conventional printed board, and thus, the substrate has an industrial advantage.

Preferably, the electrical insulating layer of the thermal conductive substrate of the present invention has a thickness of at least 0.4 mm. Accordingly, strong insulation is provided in the space between the thermal radiation board and the wiring pattern.

Preferably in the thermal conductive substrate of the present invention, the wiring pattern is composed of a lead frame and it is used as an external terminal.

Preferably in the thermal conductive substrate of the present invention, the thermal radiation board is composed of aluminum, copper or an alloy containing at least one of these metals as a main ingredient.

Preferably, a semiconductor module of the present invention is at least one power module selected from a switching power supply module, a DC—DC converter module, an inverter module, a power factor correction module, and a rectifier module. Since each of these modules has a power conversion function and in general copes with a large amount of electricity, it generates a large amount of heat. Moreover, since such a module is fixed to an external thermal radiation member in general, a thermal conductive substrate of the present invention is effective.

Embodiments for thermal conductive substrates of the present invention will be described below with reference to the attached drawings.

(First Embodiment)

FIG. 1 is a cross-sectional view showing a structure of a thermal conductive substrate in one embodiment of the present invention. This substrate is composed of a lead frame 11 as a wiring pattern, an electrical insulating layer 12 and a thermal radiation board 13. The electrical insulating layer 12 is composed of a thermal conductive mixture containing an inorganic filler and a thermosetting resin. The content of the inorganic filler is preferred to be in a range from 70 wt % to 95 wt %, and especially, in a range from 85 wt % to 95 wt %. When the content of the blended inorganic filler is less than the above-identified range, a thermal radiation property of the substrate deteriorates. The thermal expansion coefficient of the electrical insulating layer 12 is increased when the inorganic filler content is reduced, and this hinders the tendency of the substrate to warp and protrude toward the thermal radiation board with the rise of temperature. When the content exceeds the range, fluidity of the thermal conductive composition may deteriorate, and thus, integration with the wiring pattern 11 and also with the thermal radiation board 13 may become difficult.

The inorganic filler can be selected appropriately from the aspects of electric insulation and thermal conductivity. Preferably, it contains at least one powder of a main ingredient selected from $Al_2O_3$, MgO, BN, $Si_3N_4$, AlN, $SiO_2$ and SiC, since these ingredients have good thermal conductivity and allow the manufacturing of a substrate with high thermal radiation property. Especially use of $Al_2O_3$ or $SiO_2$ facilitates mixing with a thermosetting resin. Use of AlN especially raises thermal radiation of the thermal conductive substrate. Furthermore, the inorganic filler is preferred to have an average particle diameter in a range from 0.1 $\mu$m to 100 $\mu$m. When the particle diameter is out of the range, the filling property of the filler or the thermal radiation of the substrate may be decreased.

Preferably, the main ingredient of the thermosetting resin in a thermal conductive mixture is at least one resin selected from an epoxy resin, a phenol resin and an isocyanate resin, since each of these resins is excellent in thermal resistance, mechanical strength, and electrical insulation. A thermal conductive mixture can be produced by weighing the respective materials and mixing them. Apparatus such as a ball mill, a planetary mixer, a stirring mill or the like can be used for mixing.

The elastic modulus of the electrical insulating layer at room temperature is preferred to be not higher than 50 GPa, more preferably, in a range from 25 GPa to 40 GPa. When the elastic modulus is too high, the electrical insulating layer becomes hard and brittle. Such an electrical insulating layer will be susceptible to cracks due to the increased stress when the substrate is subject to temperature change or reflow-soldering.

The wiring pattern 11 can be made of any metals having high electrical conductivity. Preferable examples include copper, iron, nickel, aluminum, or alloys based on the metals, since they show less resistance. There is no specific limitation on a method of forming the wiring pattern 11, but etching or punching can be applied. It is preferable that the surface of the wiring pattern 11 is plated with at least one metal or alloy selected from nickel, tin, solder, gold and palladium. As a result of plating, the wiring pattern 11 will have improved corrosion resistance and oxidation resistance, and adherence with a thermal conductive composition is improved, and thus, the reliability of the thermal conductive substrate is improved.

It is further preferable that the wiring pattern 11 has a roughened surface to be adhered with the thermal conductive resin composition, since the adhesion strength is improved and thus the reliability also is improved. There is no limitation on the means of roughening, but blasting or etching can be used.

The material of the thermal radiation board 13 can be selected appropriately by considering thermal conductivity or coefficient of thermal expansion, from metals such as aluminum, copper, and nickel, and alloys thereof. Among them, either aluminum or copper is preferred especially, since they have high coefficients of linear expansion and thus they tend to accelerate warping of a substrate to protrude toward the thermal radiation board as the temperature rises.

It is preferable that the thermal conductive mixture is filled up to the spacing of the lead frame to form a substantially flush surface at the time of applying heat and pressure. Providing a flush surface facilitates post-processes such as leveling or solder-resist treatment of the substrate surface, and components can be mounted easily among the circuit patterns.

Preferably, the electrical insulating layer has a thickness (a thickness of a space between the wiring pattern and the thermal radiation board) of at least 0.4 mm. Accordingly, powerful insulation is provided to the space between the wiring pattern and the thermal radiation board in order to provide a preferable substrate for the power electronics field.

Figure 2A:
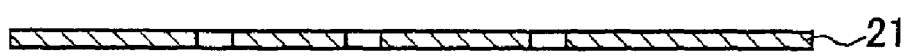
FIGS. 2A and 2B are cross-sectional views of respective steps to show a method of manufacturing a thermal conductive substrate in the first embodiment of the present invention.
Figure 2A:
Figure 2A:
Figure 2B:
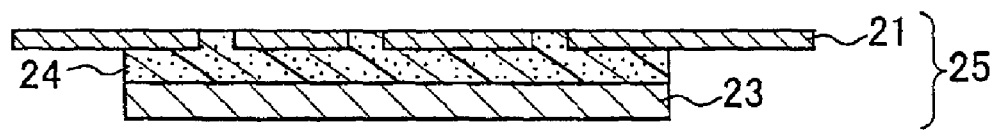

FIGS. 2A and 2B are cross-sectional views of respective steps to show a method of manufacturing a thermal conductive board in one embodiment described in FIG. 1. In FIG. 2A, 21 denotes a lead frame as a wiring pattern, 22 denotes a thermal conductive mixture containing 70–95 wt % of an inorganic filler and 5–30 wt % of a thermosetting resin, and 23 denotes a thermal radiation board. These components are laminated and subjected to heat and pressure as shown in FIG. 2A. In FIG. 2B, the thermal conductive mixture 22 is filled in the spacing of the lead frame 21 so as to provide a substantially flush surface, and the thermosetting resin contained in the thermal conductive mixture 22 is cured to form a rigid electrical insulating layer 24. At the same time, the electrical insulating layer 22 and the thermal radiation board 23 are adhered to provide a thermal conductive substrate 25. If required, this process can be followed by, for example, a solder-resist printing, cutting of the lead frame, treatment of terminals and soldering of components. In an example of the solder-resist printing, solder-resist ink is printed by screen printing before the ink is cured. An example of suitable solder-resist ink is thermosetting ink on the market. The frame cutting will be carried out for dividing connected external terminals, and it can be performed by using a cast or a shearing tool. Alternatively, terminals can be used for external terminals after being cut, and the terminals will be subject to a treatment such as bending or plating.

As indicated in this embodiment, a lead frame is used preferably as a wiring pattern since a thick wiring pattern can be provided to decrease losses caused by electrical resistance. Moreover, since a part of the wiring pattern can be used as an external terminal, a separate external terminal can be omitted or losses caused by connection resistance can be suppressed.

(Second Embodiment)

Figure 3A:
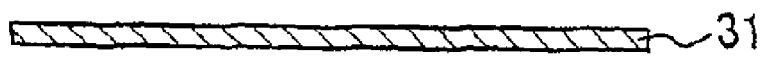
FIGS. 3A–3C are cross-sectional views of respective steps to show a method of manufacturing a thermal conductive substrate in a second embodiment of the present invention.
Figure 3A:
Figure 3A:
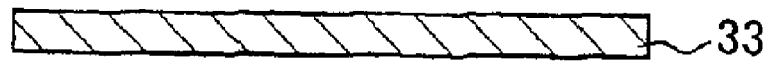
Figure 3B:
Figure 3C:
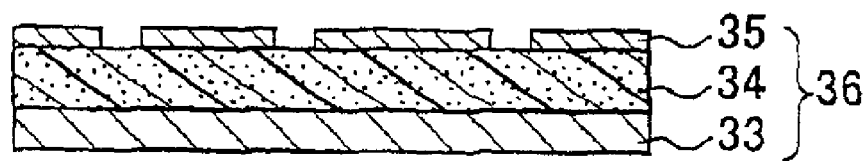

FIG. 3A–3C are cross-sectional views of respective steps to show a method of manufacturing a thermal conductive substrate in another embodiment of the present invention. In FIG. 3A, 31 denotes a metal foil, 32 denotes a thermal conductive mixture as described in the first embodiment, and 33 denotes a thermal radiation board as described in the first embodiment. These components are laminated and subjected to heat and pressure as shown in FIG. 3A. The thermosetting resin in the thermal conductive mixture 32 is cured to be an electrical insulating layer 34, and the electrical insulating layer 34 is integrated with the metal foil 31 and the thermal radiation board 33 by adhesion as shown in FIG. 3B. Subsequently, the metal foil 31 is patterned to provide a wiring pattern 35, so that a completed thermal conductive substrate 36 is provided as shown in FIG. 3C. If required, this process can be followed by, for example, a solder-resist printing, soldering of an external terminal and soldering of a component, which can be carried out by any suitable conventional technique.

The metal of the foil can be selected from any metals having high electric conductivity as in the first embodiment. Preferable examples include copper, iron, nickel, aluminum or alloys based on any of these metals, since the metals have low electric resistance. There is no specific limitation on patterning methods, but chemical etching or the like can be used.

(Third Embodiment)

Figure 4A:
FIGS. 4A–4E are cross-sectional views of respective steps to show a method of manufacturing a thermal conductive substrate in a third embodiment of the present invention.
Figure 4B:
Figure 4C:
Figure 4C:
Figure 4C:
Figure 4D:
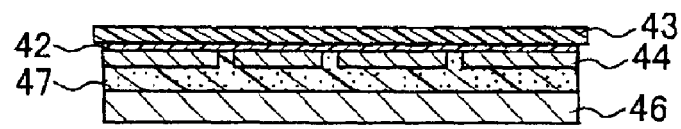
Figure 4E:
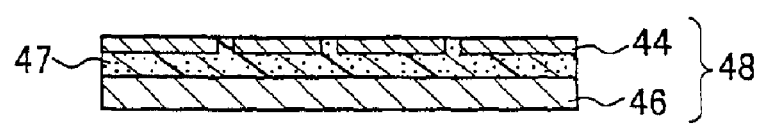

FIGS. 4A–4E are cross-sectional views of respective steps to show a method of manufacturing a thermal conductive substrate in still another embodiment of the present invention. In FIG. 4A, a metal foil 41 is adhered onto a releasing film 43 via an adhesive layer 42. This metal foil 41 is patterned to provide a wiring pattern 44 as shown in FIG. 4B. The wiring pattern 44 is reversed to be laminated on a thermal conductive mixture 45 and a thermal radiation board 46 as described in the first embodiment in this order, so that the wiring pattern 44 is contacted with the thermal conductive mixture 45 as shown in FIG. 4C. The laminate is subjected to heat and pressure so that the thermosetting resin in the thermal conductive mixture 45 is cured to become an electrical insulating layer 47, and simultaneously, the wiring pattern 44 is integrated with the thermal radiation board 46 by adhesion as shown in FIG. 4D. Later, the releasing film 43 and the adhesive layer 42 are eliminated to provide a thermal conductive substrate 48 as shown in FIG. 4E. The above-mentioned steps can be followed by solder-resist printing, soldering of an external terminal and soldering of components, if required, by means of a conventional technique.

The releasing film 41 is required to be resistant to heat and pressure while the film should be removed in a following step. Such a film can be selected from, for example, plastic films such as PPS (polyphenylene sulfide) and PPE (polyphenylene ether), and metal foils such as a copper foil and an aluminum foil. The adhesive layer 42 should prevent peeling of the metal foil 41 in a step of patterning as shown in FIG. 4B, and it should permit peeling and removing the same metal foil 41 in the step shown in FIG. 4E. The adhesive layer 42 may be selected from organic adhesives such as a urethane-based adhesive, an epoxy-based adhesive or metal layers such as a nickel-phosphorus layer.

There is no limitation on patterning methods, but chemical etching or the like can be used. Preferably, the thermal conductive mixture 45 is filled to cover the end face of the wiring pattern 44 at the time of application of heat and pressure as shown in FIG. 4D. It is further preferable that the thermal conductive mixture 45 is filled in the spacing of the wiring pattern 44 up to the surface of the pattern so as to provide a substantially flush surface in a similar way as shown in FIG. 1. By providing a flush surface, post-processes such as leveling or solder-resist treatment of the substrate surface can be carried out easily, and performance in mounting of components in the circuit pattern is improved. Moreover, adhesion between the circuit pattern and the electrical insulating layer is improved.

(Fourth Embodiment)

Figure 5A:
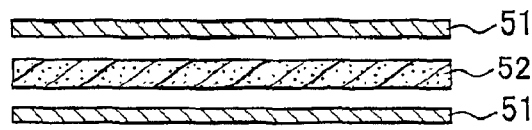
FIGS. 5A–5G are cross-sectional views of respective steps to show a method of manufacturing a thermal conductive substrate in a fourth embodiment of the present invention.
Figure 5B:
Figure 5C:
Figure 5D:
Figure 5E:
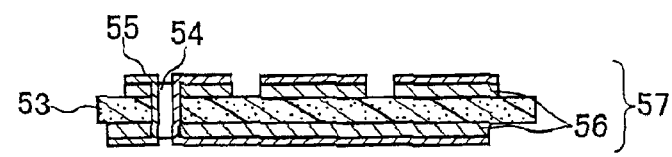
Figure 5F:
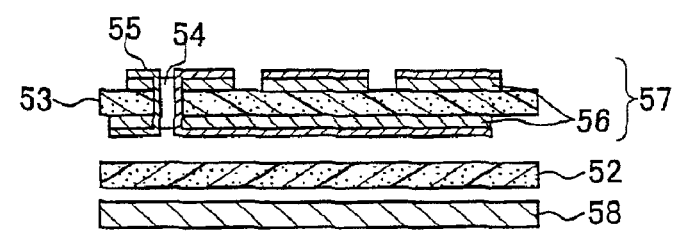
Figure 5G:
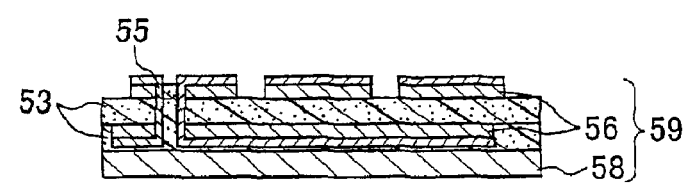

FIG. 5A–5G are cross-sectional views of respective steps to show a method of manufacturing a thermal conductive substrate of a separate embodiment of the present invention. In FIG. 5A, metal foils 51 described in the third embodiment are provided onto the both surfaces of a thermal conductive mixture 52. The thermal conductive mixture 52 with the metal foils 51 is cured by applying heat and pressure so as to prepare an electrical insulating layer 53, so that a double-sided board with the metal foils 51 are manufactured as shown in FIG. 5B. Next, an opening 54 is formed in the double-sided board as shown in FIG. 5C and a through hole 55 is provided by plating the opening 54 as shown in FIG. 5D. Subsequently, the metal foils 51 are patterned to make wiring patterns 56 so that a double-sided wiring substrate 57 is formed as shown in FIG. 5E. This double-sided wiring substrate 57, the thermal conductive mixture 52 and a thermal radiation board 58 described in the first embodiment are laminated in this order, and subjected to heat and pressure. As a result, the thermal conductive mixture is cured and at the same time, the double-sided substrate 57 is integrated with the thermal radiation board 58 as shown in FIG. 5F, so that a thermal conductive substrate 59 having two layers of wiring patterns 56 is completed. This process can be followed by a solder-resist printing, soldering of an external terminal and soldering of components, if required, by a suitable conventional technique.

Plating can be carried out by a known technique, such as electrolytic copper plating and electroless copper plating. Furthermore, interlayer connection of a double-sided board is not limited to a plated through hole as described in the embodiment, but other connection methods such as via-formation with a conductive paste and interlayer connection with a metal post can be selected.

The patterning method described in the third embodiment can be used in this embodiment.

(Fifth Embodiment)

Figure 6A:
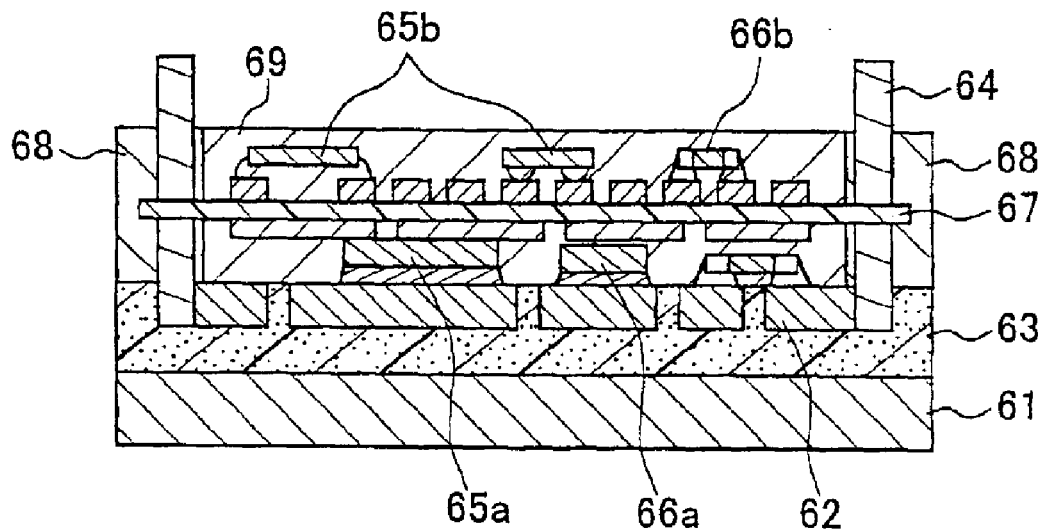
FIGS. 6A and 6B show a cross-sectional view and a plan view to illustrate a structure of a semiconductor module in a fifth embodiment of the present invention.
Figure 6B:
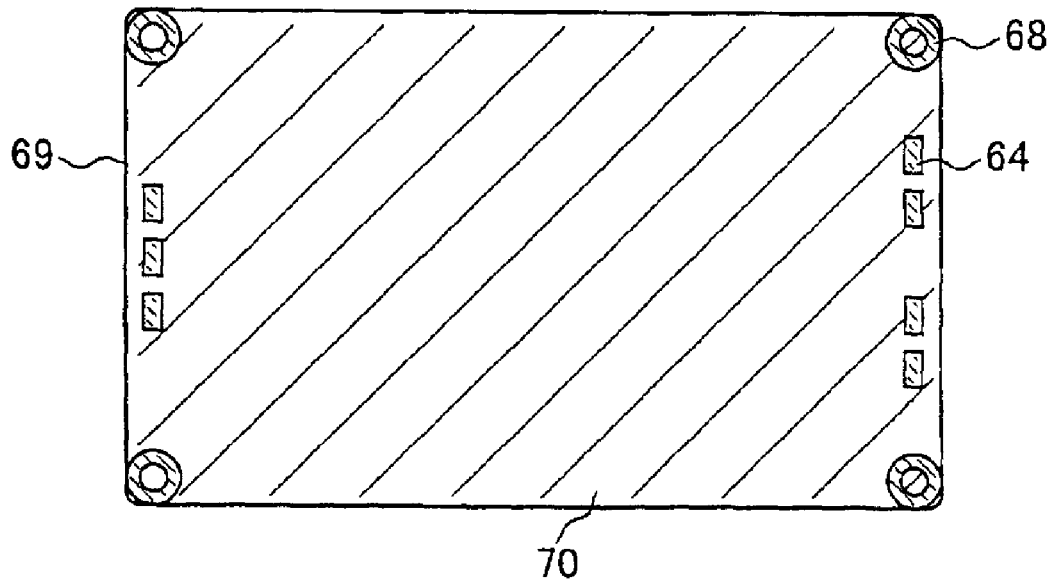
Figure 7A:
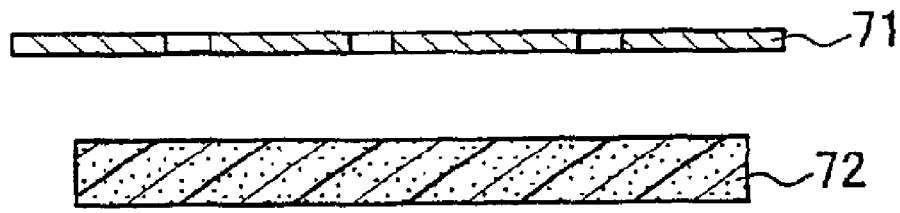
FIGS. 7A and 7B are cross-sectional views of respective steps to show a method of manufacturing a conventional thermal conductive substrate.
Figure 7B:
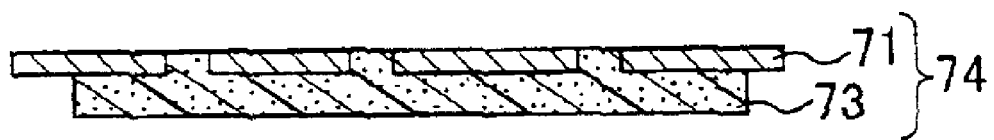

FIG. 6A is a cross-sectional view showing a structure of a semiconductor module in one embodiment of the present invention, and FIG. 6B is a plan view showing the appearance. A thermal conductive substrate in FIG. 6A is similar to that in FIG. 1, in which 61 denotes a thermal radiation board, 62 denotes a wiring pattern, and 63 denotes an electrical insulating layer. End parts of the wiring pattern 62 are cut and bent so as to be used as external electrodes 64. On the thermal conductive substrate, a semiconductor device 65a and a passive part 66a are mounted.

Similarly, a semiconductor device 65b and a passive part 66b are mounted on another circuit substrate 67. This circuit substrate 67 is inserted in the external electrodes 64 and connected with the circuit on the thermal conductive substrate. As shown in FIG. 6B, substrate-fixing components 68 provided with openings for fixing to an external thermal radiation member are attached to the four corners of the thermal radiation board 61, and a case 69 for protecting these circuits is mounted for covering the circuit substrate and the components so as to compose a semiconductor module 70.

There is no specific limitation on the above-described circuit substrate 67, but any commonly-used printed wiring boards such as glass-epoxy substrates and paper-phenol substrates can be used. There is no limitation on the method of mounting the semiconductor device and passive part, but other methods such as soldering or wire-bonding can be applied.

The case 69 can be formed of PC polycarbonate), PPS (polyphenylene sulfide) or the like in order to keep the electrical insulation between the external electrodes 64. The interior of the case can be sealed if required for improving airtightness and thermal radiation of the circuit. The sealing material can be, for example, silicone or urethane. The case can be omitted as long as the insulation among the components and terminals can be maintained.

The substrate-fixing components 68 are not limited to post components provided with openings as shown in FIGS. 6A and 6B, but for example, the post components can have screw holes. The substrate-fixing components can be omitted as long as the semiconductor module can be fixed to the external thermal radiation member at the ends or at the sides, and, for example, the thermal radiation boards can be provided with openings or notches.

For practicing the present invention in the respective embodiments, preferably, the degree of warping of the thermal conductive substrate with respect to the external thermal radiation member after mounting of components is at most $1/200$, more preferably, at most $1/500$ of the substrate length at room temperature. In general, the external thermal radiation member has a flat surface to be contacted with the substrate. In such a case, warping with respect to this flat surface can be identified with a warping with respect to the external thermal radiation member. The warping can be controlled by, for example, using a cast in a step of applying heat and pressure to the substrate in order to restrict the substrate shape; cooling the substrate from the heated state to a room temperature under pressure; or annealing by applying further pressure after the step of applying heat and pressure.

For exerting the present invention in the respective embodiments, wiring patterns, electrical insulating layers and thermal radiation boards should be selected properly depending on the thermal expansion coefficients thereof. In the selection, preferably, the thermal expansion coefficient of the thermal radiation board is larger than the average thermal expansion coefficient of the wiring pattern and of the insulating layer. It is more preferable that the thermal expansion coefficient $\alpha 1$ of the thermal radiation board is larger than the thermal expansion coefficient $\alpha 2$ of the electrical insulating layer at or below the glass transition temperature, and that the thermal expansion coefficient $\alpha 2$ is larger than the thermal expansion coefficient $\alpha 3$ of the wiring pattern. If the thermal radiation board has a thermal expansion coefficient larger than the average thermal expansion coefficient of the wiring pattern and of the insulating layer, the thermal conductive substrate warps easily to protrude toward the thermal radiation board with a rise in the temperature due to the difference in the thermal expansion coefficients. The average thermal expansion coefficient in this case is obtained as the weighted average of the respective thermal expansion coefficients of the wiring pattern and of the electrical insulating layer depending on the layer thickness. When the thermal expansion coefficient $\alpha 1$ of the thermal radiation board is larger than the thermal expansion coefficient $\alpha 2$ of the electrical insulating layer at or below the glass transition temperature and the thermal expansion coefficient $\alpha 2$ is larger than the thermal expansion coefficient $\alpha 3$ of the wiring pattern, the thermal conductive substrate warps easily to protrude toward the thermal radiation board with a rise of the temperature due to the difference in the thermal expansion coefficients. In addition, stress occurring in the electrical insulating layer due to the difference in the thermal expansion coefficients between the thermal radiation board and the wiring pattern is reduced, and this can prevent cracks in the electrical insulating layer or peeling of the electrical insulating layer from either the wiring pattern or from the thermal radiation board, which may occur due to the stress. And thus, a thermal conductive substrate with high reliability can be manufactured.

In the above-mentioned selection, preferably, the thermal radiation board is aluminum, copper, or an alloy containing at least either of them as a main ingredient. The metals have excellent mechanical strength and high thermal conductivity, and furthermore, they have relatively large coefficients of thermal expansion. Therefore, the thermal conductive substrate warps easily to protrude toward the thermal radiation board as the temperature rises, and the wiring pattern and the electrical insulating layer can be selected easily.

It is preferable in the respective embodiments that the thermal conductive mixture is shaped to be sheets, since a sheet can be handled easily and heat and pressure can be applied more easily for integration with a wiring pattern and with a thermal radiation board. Examples of the methods for forming sheets include a doctor blade method, coating and extrusion.

In the respective embodiment, the electrical insulating layers can contain a reinforcer, since such a reinforcer is useful in improving strength and processability of the insulating layer, and it enables control of the thermal expansion coefficient. The reinforcer can be selected from, for example, a glass woven fabric, a glass nonwoven fabric, a ceramic nonwoven fabric and an aramid nonwoven fabric. Among them, a glass woven fabric, a glass nonwoven fabric and a ceramic nonwoven fabric are preferable since the fabrics have high thermal conductivity. A glass nonwoven fabric is particularly preferable since a wiring pattern can be implanted easily in an electrical insulating layer containing a glass nonwoven fabric.

Thermal conductive substrates of the present invention and a method of manufacturing the same are described below in detail by referring to specific examples.

EXAMPLE 1

For manufacturing a thermal conductive mixture used in this example, an inorganic filler and a thermosetting resin composition were mixed and processed to prepare a slurry. Compositions of the thermal conductive mixture are as follows.
(1) Inorganic filler: 89 wt % of $Al_2O_3$ (AS-40 produced by Showa Denko K.K., having an average particle diameter of 12 $\mu$m)
(2) Thermosetting resin: 10 wt % of a brominated polyfunctional epoxy resin (NVR-1010 produced by Japan REC Co., Ltd., containing a curing agent)
(3) Additives: 0.05 wt % of a curing accelerator (imidazole produced by Japan REC Co., Ltd.), 0.4 wt % of Carbon Black produced by Toyo-carbon Co., Ltd., and 0.55 wt % of a coupling agent (Plen-act KR-46B produced by Ajinomoto Co., Ltd.) Methyl ethyl ketone (MEK) was included as a solvent in the materials before mixing the materials in a stir-defoamer produced by MATSUO SANGYO. Addition of MEK lowers the viscosity of the mixture so that the mixture can be processed to be a slurry, though MEK is not included in the compositions to be blended since it is evaporated in a subsequent drying step.

This slurry was coated by a doctor blade method on a releasing film of polyethylene terephthalate (PET) having a releasing surface. Later, the slurry was dried at 90° C. for evaporating the solvent, so that a sheet of a thermal conductive mixture was manufactured.

For a thermal radiation board, a copper board having a thickness of 1 mm (the thermal expansion coefficient is 17 ppm/° C.) was prepared. Furthermore, a copper board having a thickness of 0.5 mm was etched by means of a commercially available etching solution to prepare a wiring pattern so as to prepare a patterned lead frame.

Similar to the case of FIG. 2A, the lead frame, the thermal conductive mixture and a thermal radiation board were laminated in this order and subjected to heat of 170° C. and pressure of 5 Pa for 15 minutes. Thereby, the thermal conductive resin composition flowed to the surface of the lead frame, and the thermosetting resin contained in the composition was cured to be rigid, and thus, a substrate having a thickness of 2.0 mm as shown in FIG. 2B (the electrical insulating layer has a thickness of 0.5 mm) was manufactured.

Subsequently, the substrate was treated with heat for 6 hours at 175° C. in a nitrogen atmosphere in order to cure the thermosetting resin and thus, a thermal conductive substrate was provided. Later, thermosetting solder-resist ink was printed by screen printing, and subsequently, components were mounted by reflow-soldering. In a measurement after mounting of the components, the warping range was from 0.05 mm to 0.12 mm when the substrate length was 100 mm.

Substrates identified as a–f were manufactured similarly by preparing a mixture of inorganic fillers and a thermosetting resin, where the ratio of the inorganic filler of the thermal conductive mixture to the thermosetting resin was varied while the ratio of the thermosetting resin to the remaining additives was constant. Sheets of thermal conductive mixtures alone were processed to be flat plates having a thickness gap of 0.4 mm and were cured under the same condition of temperature and pressure so as to provide samples for physical measurement of the electrical insulating layers.

Figure 8:
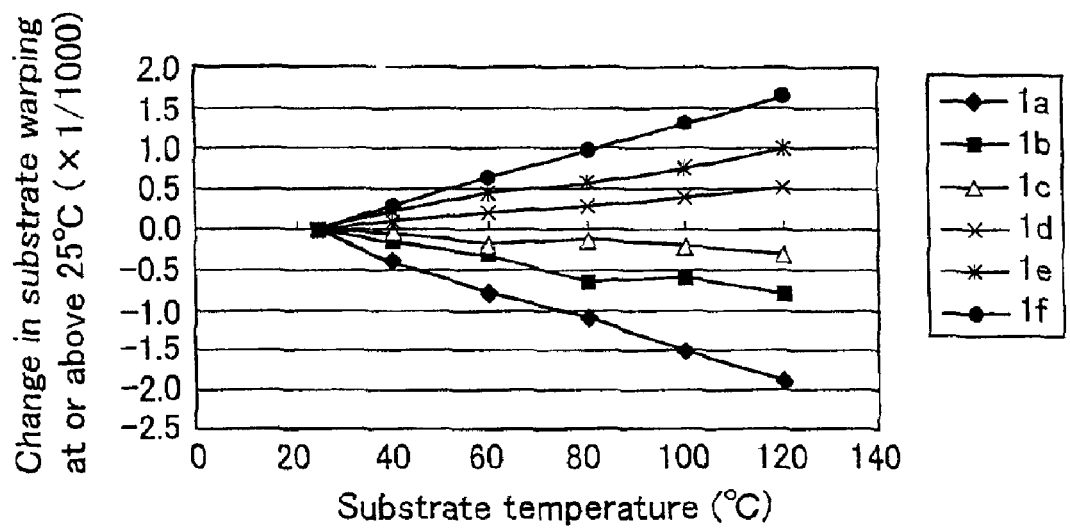
FIG. 8 is a graph indicating change in temperatures for warping of a thermal conductive substrate in Example 1 of the present invention.

The following Table 1 shows the results of a measurement for the thermal expansion coefficients and thermal resistance of the substrates (a–f) in Example 1 and samples for evaluating physical properties. FIG. 8 shows temperature variation for substrate warping.

TABLE 1

| Sample Number | Filler content (wt %) | Thermal expansion coefficient (ppm/° C.) | Thermal resistance (° C./W) |
|---|---|---|---|
| 1a | 85 | 26 | 1.72 |
| 1b | 87 | 20 | 1.10 |
| 1c | 88 | 17 | 0.96 |
| 1d | 89 | 15 | 0.87 |
| 1e | 90 | 12 | 0.83 |
| 1f | 91 | 10 | 0.74 |

The respective thermal expansion coefficients were measured by means of a thermal mechanical analyzer (TMA) produced by Seiko Instrument Inc. Each substrate was heated in a thermostat before measuring the length of 100 mm at the central portion of the substrate by means of a laser type surface roughness measurer produced by Rodenstock while monitoring temperatures by using a thermocouple. A warping degree was a distance between the both ends at the most warped part of the substrate. The thermal resistance was measured by using an instrument produced by CATS INC. The measurement was carried out by soldering a semiconductor (TO-220 package) on each of the substrates, applying a thermal conductive compound (product of Toray Silicone Co., Ltd.) on the thermal radiation board of the substrate, and fixing the thermal radiation board at the four corners to a heat sink having a fin with screws. Later, power of 50 W was applied to the semiconductor and the voltage between a base and an emitter of the semiconductor was monitored so as to obtain temperatures of the semiconductor by referring to the temperature properties of the voltage, from which the thermal resistance was calculated. The substrate temperature immediately after the semiconductor connection was 110° C. for the substrate of 1c.

Table 1 and FIG. 8 show that changes in the inorganic filler content, i.e., changes in the thermal expansion coefficient of the electrical insulating layer, also change the temperature property of the warping. Since the thermal radiation board has a thermal expansion coefficient of 17 ppm/° C., the temperature property of the warping varies depending on the relative difference in the thermal expansion coefficients. The thermal resistance was increased more in a substrate that warped and protruded toward the thermal radiation board.

EXAMPLE 2

A thermal conductive mixture was manufactured in the same manner as Example 1. The compositions of the thermal conductive mixture are as follows.

(1) Inorganic filler: 88 wt % of $Al_2O_3$ (AS-40 produced by Showa Denko K.K, having an average particle diameter of 12 μm)
(2) Thermosetting resin: 11.5 wt % of epoxy resin (XNR-5002 produced by Nagase Ciba Co., Ltd.)
(3) Additives: 0.3 wt % of a silane-based coupling agent (A-187 produced by Nippon Unicar Company Limited), 0.2 wt % of Carbon Black produced by Toyo-carbon Co., Ltd.

The above-described materials were mixed, and MEK was added to lower the viscosity. Subsequently, the mixture was coated on a PET film in the same way as Example 1 so that a cured sheet of thermal conductive product was manufactured.

A slurry of the mixture was then impregnated in a glass nonwoven fabric (weight per unit: 50 g/m² and thickness: 0.2 mm) before drying at 120° C. to evaporate the solvent, so that a cured thermal conductive sheet containing a reinforcer was manufactured.

The thermal radiation board used here was an aluminum board having a thickness of 1 mm (thermal expansion coefficient was 23 ppm/° C.). Furthermore, a copper board having a thickness of 0.5 mm was etched by a known technique to form a pattern and plated with nickel so as to prepare a lead frame.

A thermal radiation board, a thermal conductive mixture and the wiring pattern were laminated in the same manner as Example 1, and heat of 170° C. and pressure of 5 Pa were applied for 60 minutes in order to manufacture a substrate having a thickness of 2.5 mm as shown in FIG. 1 (the electrical insulating layer had a thickness of 1.0 mm). In a similar manner as Example 1, only the thermal conductive mixture was cured for manufacturing samples for measuring physical properties of the electrical insulating layers.

Figure 9:
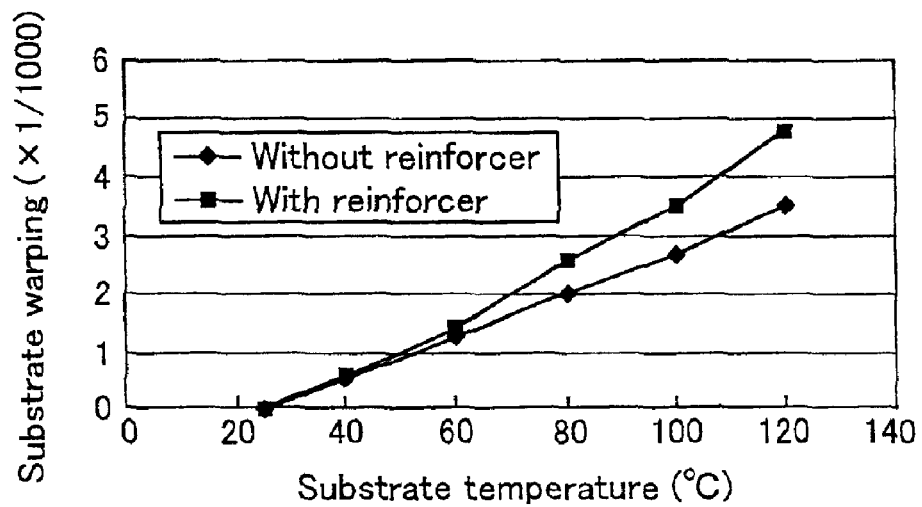
FIG. 9 is a graph indicating change in temperatures for warping of a thermal conductive substrate in Example 2 of the present invention.

A thermal expansion coefficient of an electrical insulating layer without reinforcer was 20 ppm/° C., while the same coefficient was 13 ppm/° C. when a reinforcer was added to the electrical insulating layer. FIG. 9 shows a measurement result concerning the temperature change for warping of these substrates. FIG. 9 demonstrates that the thermal conductive substrate warps to protrude toward the thermal radiation board with the rise in temperature corresponding to the thermal expansion coefficient.

For evaluating the reliability, a cycling test was performed in a temperature range from −55° C. to 125° C. after fixing each of these substrates with screws at the four corners to an aluminum heat sink having a thickness of 30 mm. No cracks occurred in a substrate having no reinforcer even after 2000 cycles, while peeling was observed in the space between the wiring pattern and the electrical insulating layer at about 1500 cycles for a substrate having a reinforcer. This fact demonstrates that the reliability is improved when a thermal radiation board has a thermal expansion coefficient larger than that of the electrical insulating layer, and the thermal expansion coefficient of the electrical insulating layer is larger than the thermal expansion coefficient α3 of the wiring pattern.

EXAMPLE 3

For manufacturing a thermal conductive mixture used for this example, an inorganic filler and a thermosetting resin composition were mixed and processed to prepare a slurry. Compositions of the thermal conductive mixture are as follows.

(1) Inorganic filler: 89 wt % of $Al_2O_3$ (AL-33 produced by Sumitomo Chemical Co., Ltd., having an average particle diameter of 12 μm)
(2) Thermosetting resin: 10 wt % of a brominated polyfunctional epoxy resin (NVR-1010 produced by Japan REC Co., Ltd., containing a curing agent)
(3) Additives: 0.05 wt % of a curing accelerator (imidazole produced by Japan REC Co., Ltd.), 0.4 wt % of Carbon Black produced by Toyo-carbon Co., Ltd., and 0.55 wt % of coupling agent (Plen-act KR-46B produced by Ajinomoto Co., Ltd.) Methyl ethyl ketone MEK) as a solvent was included in the materials before mixing the materials in a stir-defoamer produced by MATSUO SANGYO. Similar to the case of Example 1, the thermal conductive mixture was coated on a releasing film to manufacture a sheet of the thermal conductive mixture.

Apart of the thermosetting resin in the composition was substituted by a flexible epoxy resin (YD-171 produced by Tohto Kasei Co., Ltd.) in order to manufacture sheets (3a-3d) of the thermal conductive mixture in the same manner.

A thermal radiation board was prepared from an aluminum board having a thickness of 0.5 mm and the wiring pattern was prepared from a copper foil having a thickness of 0.2 mm. The thermal radiation board, each sheet of the thermal conductive mixture and the copper foil were laminated and subjected to heat starting from a room temperature up to 175° C. and pressure of 5 Pa for 1 hour in order to integrate the copper foil and the thermal radiation board as shown in FIG. 3B. Subsequently, an etching-resist film was applied on the copper foil, and a mask of a circuit pattern was covered before exposure to ultraviolet rays. Through the following steps of development, etching with copper chloride and also resist-peeling, a thermal conductive substrate as shown in FIG. 3C was provided. Similar to the first and second embodiments, only the thermal conductive mixture was cured for providing samples for the physical evaluation.

The elastic modulus of each electrical insulating layer was evaluated at 40° C. For confirming the reliability, each substrate was dipped in a solder of 260° C. for one minute so as to observe the subsequent changes in the layer. The results are shown in Table 2. The elastic modulus was measured by using a dynamic mechanical analyzer (DMA) produced by Seiko Instrument Inc.

TABLE 2

| Sample Number | Substitution rate of flexible resin (wt %) | Elastic modulus at 40° C. | Electrical insulating layer after solder-dipping test |
|---|---|---|---|
| 3a | 0 | 52 | Crack occurrence |
| 3b | 10 | 43 | No abnormality |
| 3c | 20 | 38 | No abnormality |
| 3d | 30 | 29 | No abnormality |

The results in Table 2 demonstrate that the elastic modulus of a thermal conductive mixture is lowered as the content of the added flexible epoxy is increased. In an observation after the solder dipping test, crack occurrence was limited to the electrical insulating layer of a substrate having high elastic modulus in which the thermosetting resin was not substituted by a flexible resin. This fact demonstrates that a substrate will have high reliability when the elastic modulus at room temperature is 50 GPa or less.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A semiconductor module comprising a thermal conductive substrate comprising a wiring pattern, an electrical insulating layer and a thermal radiation board, the electrical insulating layer being composed of a thermal conductive mixture containing 70–95 wt % of an inorganic filler and 5–30 wt % of a thermosetting resin, and the thermal radiation board having a thermal expansion coefficient that is larger than an average thermal expansion coefficient of the wiring pattern and of the electrical insulating layer, a semiconductor device is mounted on a top portion of the thermal conductive substrate; and substrate fixing components for attachment to an external thermal radiation member are provided on the thermal radiation board and attached to the external thermal radiation member on a bottom portion of the thermal conductive substrate which is opposite to the top portion of the thermal conductive substrate on which the semiconductor device is mounted with a space between the thermal conductive substrate and external thermal radiation member;

wherein the thermal conductive substrate is warped to protrude towards, and presses up against, the attached external thermal radiation member as a result of temperature of the thermal conductive substrate rising such that a space between the thermal conductive substrate and the external thermal radiation member is reduced.

2. The semiconductor module according to claim 1, wherein the thermal conductive mixture composing the electrical insulating layer has an elastic modulus of at most 50 GPa at room temperature.

3. The semiconductor module according to claim 1, wherein the electrical insulating layer contains a reinforcer.

4. The semiconductor module according to claim 3, wherein the reinforcer is a glass nonwoven fabric.

5. The semiconductor module according to claim 1, wherein the wiring pattern includes spacing that is filled with the electrical insulating layer so as to form a substantially flush surface.

6. The semiconductor module according to claim 1, wherein the electrical insulating layer has a thickness of at least 0.4 mm.

7. The semiconductor module according to claim 1, wherein the wiring pattern is composed of a lead frame and used as an external terminal.

8. The semiconductor module according to claim 1, wherein the thermal radiation board comprises aluminum, copper or an alloy containing at least one of aluminum and copper as a main ingredient.

9. The semiconductor module according to claim 1, wherein the semiconductor module is at least one power module selected from a switching power supply module, a DC—DC converter module, an inverter module, a power factor correction module, and a rectifier module.

10. The semiconductor module according to claim 1, wherein the substrate fixing components includes an aperture configured to receive a screw.

11. The semiconductor module according to claim 1, wherein the external thermal radiation member is connected to the semiconductor module via the substrate fixing components.

12. The semiconductor module according to claim 1, wherein a warping amount of the thermal conductive substrate with respect to the external thermal radiation member after mounting of a component is at most $1/500$ of a length of the substrate at room temperature.

13. A semiconductor module comprising a thermal conductive substrate comprising a wiring pattern, an electrical insulating layer, a thermal radiation board, the electrical insulating layer being composed of a thermal conductive mixture containing 70–95 wt % of an inorganic filler and 5–30 wt % of a thermosetting resin, and the thermal radiation board having a thermal expansion coefficient $\alpha 1$ that is larger than a thermal expansion coefficient $\alpha 2$ of the electrical insulating layer at or below the glass transition temperature, and the thermal expansion coefficient $\alpha 2$ is larger than a thermal expansion coefficient $\alpha 3$ of the wiring pattern;

a semiconductor device is mounted on a top portion of the thermal conductive substrate; and substrate fixing components for attachment to an external thermal radiation member are provided on the thermal radiation board and attached to the external thermal radiation member on a bottom portion of thermal conductive substrate which is opposite to the top portion of the thermal conductive substrate on which the semiconductor device is mounted with a space between the thermal conductive substrate and external thermal radiation member;

wherein the thermal conductive substrate is warped to protrude towards, and presses up against the attached external thermal radiation member as a result of temperature of the thermal conductive substrate rising such that a space between the thermal conductive substrate and the external thermal radiation member is reduced.

14. The semiconductor module according to claim 13, wherein the thermal conductive mixture composing the electrical insulating layer has an elastic modulus of at most 50 GPa at room temperature.

15. The semiconductor module according to claim 13, wherein the electrical insulating layer contains a reinforcer.

16. The semiconductor module according to claim 15, wherein the wiring pattern includes spacing that is filled with electrical insulating layer so as to form a substantially flush surface.

17. The semiconductor module according to claim 13, wherein the reinforcer glass nonwoven fabric.

18. The semiconductor module according to claim 13, wherein the electrical insulating layer has a thickness of at least 0.4 mm.

19. The semiconductor module according to claim 13, wherein the wiring pattern is composed of a lead frame and used as an external terminal.

20. The semiconductor module according to claim 13, wherein the thermal radiation board comprises aluminum, copper or an alloy containing at least one of aluminum and copper as a main ingredient.

21. The semiconductor module according to claim 13, wherein the semiconductor module is at least one power module selected from a switching power supply module, a DC—DC converter module, an inverter module, a power factor correction module, and a rectifier module.

22. The semiconductor module according to claim 13, wherein the substrate fixing components includes an aperture configured to receive a screw.

23. The semiconductor module according to claim 13, wherein the external thermal radiation member is connected to the semiconductor module via the substrate fixing components.

24. The semiconductor module according to claim 13, wherein a warping amount of the thermal conductive substrate with respect to the external thermal radiation member after mounting of a component is at most $1/500$ of a length of the substrate at room temperature.

* * * * *